US012809269B2

(12) United States Patent
Dikkers et al.

(10) Patent No.: US 12,809,269 B2
(45) Date of Patent: Nov. 24, 2026

(54) APPARATUS AND METHOD FOR DETERMINING AN ANGULAR REFLECTIVITY PROFILE

(71) Applicant: ASML Netherlands B.V., Veldhoven (NL)

(72) Inventors: Manfred Petrus Johannes Maria Dikkers, Veldhoven (NL); Paul Jean Maurice Geelen, Lommel (BE); Gerrit Jan Jacob Lof, Hapert (NL); Karel Johannes Gerhardus Hinnen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 57 days.

(21) Appl. No.: 18/853,674

(22) PCT Filed: Mar. 6, 2023

(86) PCT No.: PCT/EP2023/055606
§ 371 (c)(1),
(2) Date: Oct. 2, 2024

(87) PCT Pub. No.: WO2023/194017
PCT Pub. Date: Oct. 12, 2023

(65) Prior Publication Data

US 2025/0237962 A1 Jul. 24, 2025

(30) Foreign Application Priority Data

Apr. 7, 2022 (EP) .................................... 22167102

(51) Int. Cl.
*G03F 7/00* (2006.01)
*G03F 1/84* (2012.01)

(52) U.S. Cl.
CPC ............ *G03F 7/70091* (2013.01); *G03F 1/84* (2013.01); *G03F 7/70133* (2013.01);
(Continued)

(58) Field of Classification Search
CPC .... G03F 1/84; G03F 7/70091; G03F 7/70133; G03F 7/70283; G03F 7/70316;
(Continued)

(56) References Cited

U.S. PATENT DOCUMENTS 5,889,593 A * 3/1999 Bareket .................... G03F 1/84 356/445
6,333,777 B1 * 12/2001 Sato .................... G03F 7/70066 355/68

(Continued)

FOREIGN PATENT DOCUMENTS

CN 111868570 10/2020
WO 2005/091076 9/2005
WO WO-2019149468 A1 * 8/2019 ............. G03F 7/706

OTHER PUBLICATIONS

International Search Report and Written Opinion of the International Searching Authority directed to International Patent Application No. PCT/EP2023/055606, mailed Mar. 27, 2023; 9 pages.

(Continued)

*Primary Examiner* — Steven H Whitesell
(74) *Attorney, Agent, or Firm* — Pillsbury Winthrop Shaw Pittman, LLP

(57) ABSTRACT

An apparatus comprising a multilayer structure configured to reflect electromagnetic radiation. The apparatus comprises a sensor configured to detect an angular distribution of the electromagnetic radiation after reflection from the multilayer structure. The apparatus comprises a processor configured to generate a first function at least partially based on the angular distribution of the electromagnetic radiation
(Continued)

detected by the sensor. The processor is configured to compare the first function to a plurality of known functions associated with a plurality of known angular reflectivity profiles to identify a second function from the plurality of known functions that is most similar to the first function. The processor is configured to determine an angular reflectivity profile of the multilayer structure at least partially based on a known angular reflectivity profile that is associated with the second function.

20 Claims, 10 Drawing Sheets

(52) U.S. Cl.
CPC ...... *G03F 7/70283* (2013.01); *G03F 7/70316* (2013.01); *G03F 7/7085* (2013.01)

(58) Field of Classification Search
CPC .... G03F 7/70591; G03F 7/706; G03F 7/7085; G01J 9/02; G01J 9/0215
See application file for complete search history.

(56) References Cited

U.S. PATENT DOCUMENTS

2006/0050260 A1* 3/2006 Van De Kerkhof ........................ G03F 7/70591 355/69
2007/0285643 A1 12/2007 Wedowski et al.
2013/0100428 A1* 4/2013 Ruoff .................... B82Y 10/00 430/5
2014/0063490 A1* 3/2014 Zhang ...................... G21K 7/00 356/121
2015/0009492 A1* 1/2015 Frese ...................... G03F 7/706 356/124
2022/0381643 A1* 12/2022 Gwosch ............ G01M 11/0264

OTHER PUBLICATIONS

"Using the scanner to measure reflectivity of an EUV reticle," Research Disclosure No. 622002, Dec. 24, 2015; 2 pages.
"Research Disclosure," Research Disclosure No. 678050, Sep. 10, 2020; 6 pages.
Office Action issued in corresponding Taiwanese Patent Application No. 112111429, dated Jul. 17, 2026.

* cited by examiner

APPARATUS AND METHOD FOR DETERMINING AN ANGULAR REFLECTIVITY PROFILE

CROSS-REFERENCE TO RELATED APPLICATIONS

This application claims priority of EP Application Serial No. 22167102.7 which was filed on Apr. 23, 2022 and which is incorporated herein in its entirety by reference.

FIELD

The present invention relates to characterizing reflectivity profiles of multilayer structures used to reflect electromagnetic radiation in optical apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Multilayer structures are used to interact with electromagnetic radiation in a variety of apparatus. For example, a multilayer structure may be used as a fiducial marker for a sensing system and/or to ensure that a specific wavelength or range of wavelengths of electromagnetic radiation are preferentially reflected within an optical system. Due to differences in materials and layer thicknesses, different multilayer structures have different reflectivity properties. The reflectivity of a multilayer structure may vary in at least partial dependence upon an angle of incidence of electromagnetic radiation that is incident on, and subsequently reflected by, the multilayer structure. That is, a first angle of incidence may be associated with a larger reflectivity than a second angle of incidence. Different multilayer structures may therefore have different angular reflectivity profiles. When an angular distribution of electromagnetic radiation is reflected by a multilayer structure, an intensity profile of the reflected electromagnetic radiation may at least partially depend upon the angular reflectivity profile of the multilayer structure. The angular reflectivity profile of the multilayer structure may therefore influence an output of a system that uses the reflected electromagnetic radiation. For example, a measurement performed by a sensing system that detects the reflected electromagnetic radiation may be influenced by the angular reflectivity profile of the multilayer structure. If not accounted for, the angular reflectivity profile of the multilayer structure may negatively impact an accuracy of a measurement performed by the sensing system. It is therefore desirable to determine the angular reflectivity profile of a multilayer structure, thereby allowing an understanding of how the angular reflectivity profile of the multilayer structure influences the reflected electromagnetic radiation.

In many known apparatus, the multilayer structure is accompanied by other optical components that also interact with the electromagnetic radiation. Such optical components may also influence the intensity profile of the electromagnetic radiation. It can be difficult to distinguish between the influence that the angular reflectivity profile of the multilayer structure has, and the influences that other optical components have, on the intensity profile of the electromagnetic radiation. In many known apparatus, it is either very difficult, or practically impossible, to accurately measure the angular reflectivity profile of the multilayer structure in isolation. It is therefore desirable to provide an apparatus and method of determining the angular reflectivity profile of a multilayer structure, thereby allowing an understanding of how the angular reflectivity profile of the multilayer structure influences the reflected electromagnetic radiation.

SUMMARY

According to a first aspect of the present disclosure, there is provided an apparatus comprising a multilayer structure configured to reflect electromagnetic radiation. The apparatus comprises a sensor configured to detect an angular distribution of the electromagnetic radiation after reflection from the multilayer structure. The apparatus comprises a processor. The processor is configured to generate a first function at least partially based on the angular distribution of the electromagnetic radiation detected by the sensor. The processor is configured to compare the first function to a plurality of known functions associated with a plurality of known angular reflectivity profiles to identify a second function from the plurality of known functions that is most similar to the first function. The processor is configured to determine an angular reflectivity profile of the multilayer structure at least partially based on a known angular reflectivity profile that is associated with the second function.

Through measurement of the angular distribution of the electromagnetic radiation reflected by the multilayer structure, and subsequent comparison with known angular reflectivity profiles, the apparatus of claim 1 advantageously allows a user to determine the angular reflectivity profile of the multilayer structure, and thereby allow the user to understand the influence of the multilayer structure on the intensity profile of the reflected electromagnetic radiation. This information may be used to improve processes performed using the reflected electromagnetic radiation (e.g. to correct for measurements performed using the reflected electromagnetic radiation).

The sensor may output an intensity of the electromagnetic radiation as a function of the angles of incidence of the electromagnetic radiation. That is, the sensor may output an intensity of the electromagnetic radiation as a function of position in a pupil plane of the apparatus.

The pupil plane may be defined by a numerical aperture of the apparatus. The pupil plane may be defined as a Fourier transform plane of a plane in which the sensor is disposed (which may be referred to as an image plane) and/or a Fourier transform plane of a plane in which the multilayer structure is disposed (which may be referred to as an object plane).

The apparatus may comprise an illumination system configured to condition the electromagnetic radiation to form an illumination field through which the angular distribution of the electromagnetic radiation rotates. The sensor may be configured to detect the rotation of the angular distribution of the electromagnetic radiation through the illumination field after reflection from the multilayer structure.

Given that the reflectivity properties of the multilayer structure at least partially depend upon the angle of incidence of the electromagnetic radiation, and that the angles of incidence of the electromagnetic radiation rotate through the illumination field, the detected angular reflectivity profile of the multilayer structure also rotates through the illumination field. The inventors have found that different multilayer structures have angular reflectivity profiles that behave differently when rotated through the illumination field. Detecting the rotation of the angular distribution of the electromagnetic radiation through the illumination field therefore provides useful information for determining the angular reflectivity profile of the multilayer structure and for distinguishing between the different angular reflectivity profiles of different multilayer structures.

The illumination system may comprise a curved reflective surface configured to condition to condition the electromagnetic radiation to form an illumination field through which angles of incidence of the electromagnetic radiation rotate. The curved reflective surface may comprise a plurality of substantially flat reflective elements positioned at different angles to form the curved reflective surface.

The illumination field may have an arc shape.

The apparatus may comprise a diffuser configured to interact with the electromagnetic radiation such that the electromagnetic radiation substantially fills a numerical aperture of the apparatus.

The diffuser advantageously provides a substantially complete measurement of the angular reflectivity profile of the multilayer structure across the numerical aperture of the apparatus. The diffuser advantageously avoids any misleading results that may occur when other, incomplete illumination modes are used.

The diffuser may form part of the multilayer structure. The diffuser may comprise an optically rough surface formed proximate (e.g. underneath) the multilayer structure. The optically rough layer may comprise Chromium.

The processor may be configured to generate the first function by mathematically decomposing the angular distribution of the electromagnetic radiation detected by the sensor into a plurality of Zernike polynomial functions.

The inventors have found that Zernike polynomial functions are well-suited to accurately describing the angular distribution of the electromagnetic radiation detected by the sensor.

Mathematically decomposing generally involves representing or expressing a function as a combination of simpler component functions. In this instance, the angular distribution of the electromagnetic radiation detected by the sensor is represented as a combination of component Zernike polynomial functions.

Different angular distributions of electromagnetic radiation comprise different amounts or contributions of Zernike polynomial functions.

Each of the plurality of known functions may comprise a plurality of Zernike polynomial functions.

The plurality of Zernike polynomial functions may exclude rotationally symmetric Zernike polynomial functions.

Excluding rotationally symmetric Zernike polynomial functions advantageously filters out rotationally static contributions (e.g. from other optical components present in the apparatus, such as, for example, an illumination system) that do not vary as the angular distribution of electromagnetic radiation rotates through the illumination field.

The processor may be configured to perform a fitting process to identify the second function from the plurality of known functions.

The processor may be configured to generate the plurality of known functions in at least partial dependence upon a plurality of known reflectivity profiles associated with the plurality of known multilayer structures.

The plurality of known functions may be formed from a plurality of Zernike polynomial functions.

The fitting process may comprise performing a least squares fit.

The fitting process may comprise fitting a sine function and/or a cosine function to determine an amplitude of a Zernike polynomial function.

According to a second aspect of the present disclosure, there is provided a lithographic apparatus comprising the apparatus of the first aspect. The lithographic apparatus comprises a support structure constructed to support a patterning device, the patterning device being capable of imparting the radiation beam with a pattern in its cross-section to form a patterned radiation beam. The multilayer structure forms part of a fiducial marker located on the patterning device or the support structure. The lithographic apparatus comprises a substrate table constructed to hold a substrate. The sensor forms part of the substrate table. The lithographic apparatus comprises a projection system configured to project the patterned radiation beam onto the substrate. The lithographic apparatus comprises a measurement system comprising the fiducial marker and the sensor.

In known lithographic apparatus, the influence of the angular reflectivity profile of the multilayer structure on measurements performed by the measurement system are unaccounted for and thus result in measurement errors, e.g. pupil measurement errors. That is, the actual performance of the illumination system may be better than the known measurement systems report. This may lead to unnecessary actions such as replacement of the fiducial marker (e.g. the support structure or the patterning device).

Determining the angular reflectivity profile of a multilayer structure that forms part of a lithographic apparatus advantageously provides numerous insights into the performance of the lithographic apparatus, and avoids the unnecessary actions mentioned above in respect of known lithographic apparatus.

The illumination system may be configured to condition the radiation beam. The processor may be configured to determine an angular reflectivity profile of the illumination system in at least partial dependence upon the angular reflectivity profile of the multilayer structure.

Determining the angular reflectivity profile of the illumination system of a lithographic apparatus advantageously provides useful information that can be used to improve the performance of the lithographic apparatus.

Determining the angular reflectivity profile of the illumination system may involve a processing step of removing the influence of the angular reflectivity profile of the multilayer structure from the angular distribution of the electromagnetic radiation detected by the sensor.

Non-telecentric imaging performed by the illumination system, in combination with other influences, such as a defocus error, may lead to an unwanted shift of the patterned features on the substrate, thereby leading to lithographic errors such as overlay errors. Determining the angular reflectivity profile of the illumination system advantageously reduces non-telecentric imaging and thereby improves an accuracy of the lithographic apparatus.

The processor may be configured to perform a simulation of a proposed radiation beam propagating through the lithographic apparatus in at least partial dependence upon the angular reflectivity profile of the illumination system.

Taking into account the reflectivity profile if the illumination system when performing a simulation of a proposed radiation beam propagating through the lithographic apparatus advantageously improves an accuracy of said simulation.

The illumination system may be configured to redistribute the electromagnetic radiation into an illumination mode. The illumination mode may be a dipole illumination mode, quadrupole illumination mode, etc. The proposed radiation beam may be conditioned to form an illumination mode.

The processor may be configured to determine an angular reflectivity profile of the projection system in at least partial dependence upon the angular reflectivity profile of the multilayer structure.

Determining the angular reflectivity profile of the projection system of a lithographic apparatus advantageously provides useful information that can be used to improve the performance of the lithographic apparatus.

Determining the angular reflectivity profile of the projection system may involve a processing step of removing the influence of the angular reflectivity profile of the multilayer structure from the angular distribution of the electromagnetic radiation detected by the sensor.

According to a third aspect of the present disclosure, there is provided a method of determining an angular reflectivity profile of a multilayer structure comprising. reflecting electromagnetic radiation from a multilayer structure. The method comprises detecting an angular distribution of the electromagnetic radiation after reflection from the multilayer structure. The method comprises generating a first function at least partially based on the angular distribution of the electromagnetic radiation. The method comprises comparing the first function to a plurality of known functions associated with a plurality of known angular reflectivity profiles to identify a second function from the plurality of known functions that is most similar to the first function. The method comprises determining the angular reflectivity profile of the multilayer structure at least partially based on a known angular reflectivity profile that is associated with the second function.

The method may comprise conditioning the electromagnetic radiation to form an illumination field through which the angular distribution of the electromagnetic radiation rotates. Detecting the angular distribution of the electromagnetic radiation may comprise detecting the rotation of the angular distribution of the electromagnetic radiation through the illumination field after reflection from the multilayer structure.

The method may comprise diffusing the electromagnetic radiation before reflection from the multilayer structure such that the angular distribution of the electromagnetic radiation is substantially continuous.

Generating the first function may comprise mathematically decomposing the angular distribution of the electromagnetic radiation into a plurality of Zernike polynomial functions.

The plurality of Zernike polynomial functions may exclude rotationally symmetric Zernike polynomial functions.

Comparing the first function to a plurality of known functions associated with a plurality of known angular reflectivity profiles to identify a second function from the plurality of known functions that is most similar to the first function may comprise performing a fitting process.

According to a fourth aspect of the present disclosure, there is provided a method of projecting a patterned beam of radiation onto a substrate comprising using the multilayer structure of the third aspect to perform a measurement. The method comprises accounting for the angular reflectivity profile of the multilayer structure determined using the method of the third aspect in said measurement.

Conditioning the electromagnetic radiation may comprise using an illumination system. Accounting for the angular reflectivity profile of the multilayer structure may comprise determining an angular reflectivity profile of the illumination system in at least partial dependence upon the angular reflectivity profile of the multilayer structure.

The method may comprise performing a simulation of a proposed patterned beam of radiation in at least partial dependence upon the angular reflectivity profile of the illumination system.

Projecting the patterned beam of radiation onto the substrate may comprise using a projection system. Accounting for the angular reflectivity profile of the multilayer structure may comprise determining an angular reflectivity profile of the projection system in at least partial dependence upon the angular reflectivity profile of the multilayer structure.

According to a fifth aspect of the present disclosure, there is provided a computer program comprising computer readable instructions configured to cause a computer to carry out a method according to any of the third and fourth aspects.

According to a fifth aspect of the present disclosure, there is provided a computer readable medium carrying a computer program according to the fifth aspect.

According to a sixth aspect of the present disclosure, there is provided a computer apparatus comprising a memory storing processor readable instructions. The computer apparatus comprises a processor arranged to read and execute instructions stored in said memory. Said processor readable instructions comprise instructions arranged to control the computer to carry out a method according to any of the third and fourth aspects.

BRIEF DESCRIPTION OF THE DRAWINGS

Embodiments of the invention will now be described, by way of example only, with reference to the accompanying schematic drawings, in which.

DETAILED DESCRIPTION

Figure 1:
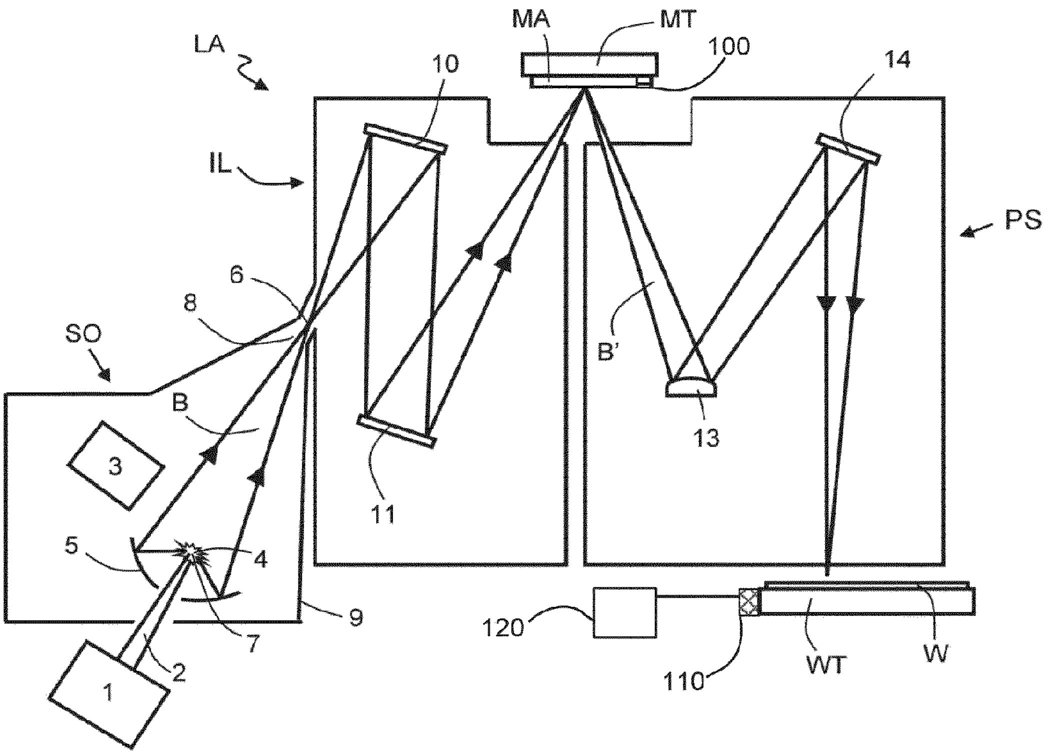
FIG. 1 schematically depicts a lithographic system comprising a radiation source and a lithographic apparatus comprising a multilayer structure according to an aspect of the present disclosure.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

Figure 2:
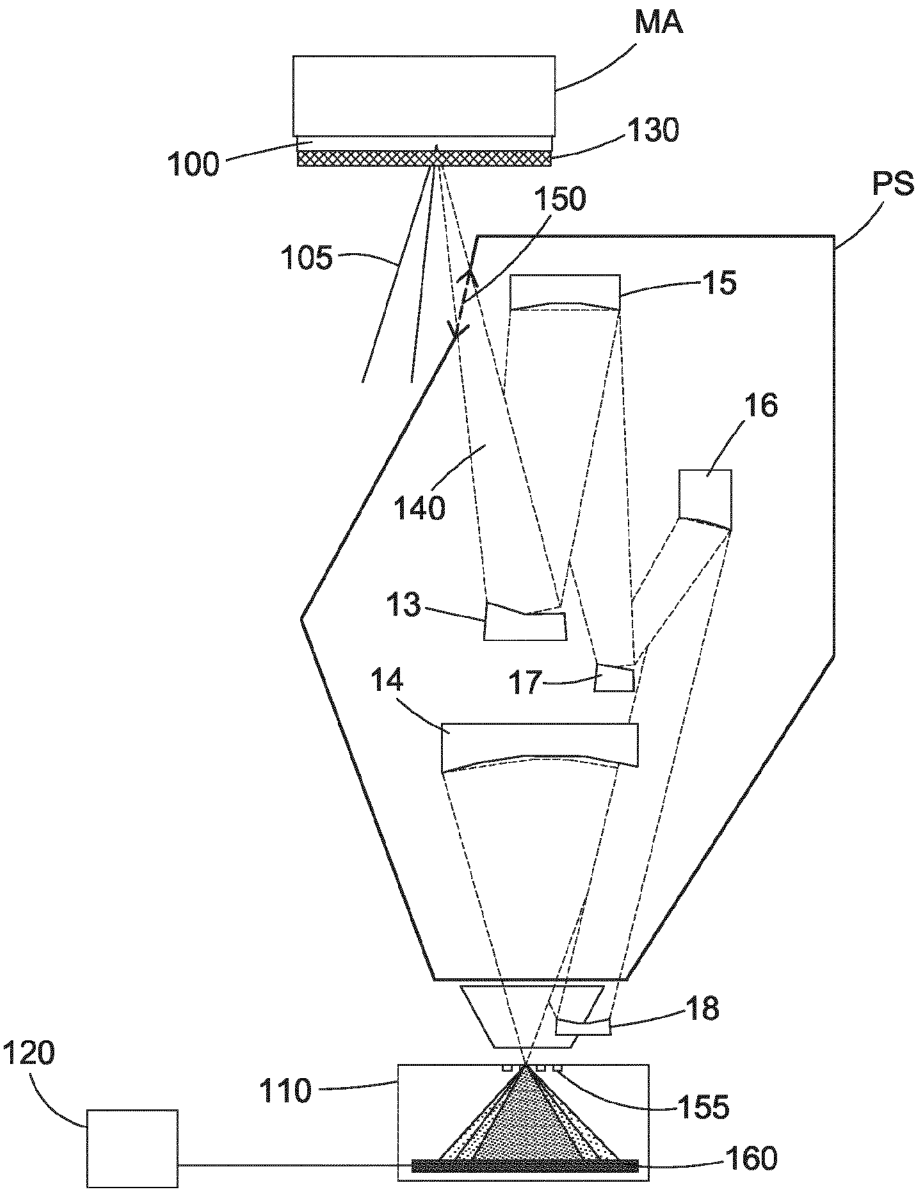
FIG. 2 schematically depicts a portion of the lithographic apparatus of FIG. 1 comprising an apparatus for determining an angular reflectivity profile of the multilayer structure in accordance with an aspect of the present disclosure.

After being thus conditioned, the EUV radiation beam B interacts with the patterning device MA. As a result of this interaction, a patterned EUV radiation beam B' is generated. The patterned EUV radiation beam B' may comprise a plurality of sub-beams generated through interaction with the patterning device MA. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors, as shown in FIG. 2).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

The lithographic apparatus LA comprises an apparatus comprising an illumination system IL configured to condition electromagnetic radiation B. The apparatus comprises a multilayer structure 100 configured to reflect the electromagnetic radiation B. The apparatus comprises a sensor 110 configured to detect an angular distribution of the electromagnetic radiation B after reflection from the multilayer structure 100. The apparatus comprises a processor 120. The processor 120 is configured to generate a first function at least partially based on the angular distribution of the electromagnetic radiation detected by the sensor 110. The processor 120 is configured to compare the first function to a plurality of known functions associated with a plurality of known angular reflectivity profiles to identify a second function from the plurality of known functions that is most similar to the first function. The processor 120 is configured to determine an angular reflectivity profile of the multilayer structure 100 at least partially based on a known angular reflectivity profile that is associated with the second function. Further details regarding this process are described below and shown across FIGS. 2-13.

In the example of FIG. 1, parts of the apparatus form part of a measurement system. The measurement system comprises the multilayer structure 100 and the sensor 110. In the example of FIG. 1, the multilayer structure 100 forms part of a fiducial marker located on the patterning device MA. The multilayer structure 100 may be located elsewhere. For example, the multilayer structure 100 may be located on the support structure MT. The sensor 110 forms part of the substrate table WT. The measurement system comprises the fiducial marker and the sensor 110. For example, the multilayer structure 100 may comprise a Transmission Image Sensor ("TIS") fiducial marker or Integrated Lens Interferometer At Scanner ("ILIAS") fiducial marker at reticle level (e.g. at the patterning device MA), and the sensor 110 may comprise an ILIAS sensor at wafer level (e.g. at the substrate W). The TIS is a sensor that is used to measure the position at substrate level of a projected aerial image of a mark pattern at the mask (reticle) level. The projected image at substrate level may be a line pattern with a line width comparable to the wavelength of the exposure radiation. The TIS measures these mask patterns using a transmission pattern with a photocell underneath it. The sensor data may be used to measure the position of the mask with respect to the substrate table in six degrees of freedom (three in translation and three in rotation). In addition, the magnification and scaling of the projected mask may be measured. The ILIAS is an interferometric wavefront measurement system that may perform static measurements on lens aberrations up to high order. ILIAS may be implemented as an integrated measurement system used for system initialization and calibration. Alternatively, ILIAS may be used for monitoring and recalibration "on-demand".

The measurement system is configured to measure an angular distribution of electromagnetic radiation B within the lithographic apparatus LA at the patterning device MA. This measurement may be referred to in the art as the EUV scanner pupil at reticle level. Results of measurements performed by the measurement system may be used to determine a performance of the illumination system IL. The multilayered structure 100 may be configured to maximize reflectivity over the range of incidence angles provided by the illumination system IL (which may be referred to in the art as the "pupil plane"). A relative change of reflectivity of the multilayer structure 100 across the pupil plane (i.e. at different angles of incidence) may be referred to in the art as "fiducial apodization". Fiducial apodization may in turn contribute to a change in an intensity profile of the electromagnetic radiation B across the pupil plane (i.e. at different angles of incidence).

An aperture stop of the lithographic apparatus LA may comprise a physical stop located somewhere in the lithographic apparatus LA which performs a radiation beam B truncation at least partially dependent on the angles of incidence of the radiation beam B. Entrance and exit pupils of the lithographic apparatus LA may be defined as an image of an aperture stop as observed at the entrance or exit of the projection system PS. The sub-beams that form the radiation beam B may propagate across a range of angles around a chief ray angle. The chief ray angle may, for example, be about 6°, and the range of angles may vary from about 1° to about 11° around the chief ray angle, e.g. in the Y-direction Imaging telecentricity may at least partially determine a performance of the illumination system IL. Imaging non-telecentricity may result from, for example, a misalignment between the illumination system IL with respect to the optical axis. Imaging non-telecentricity in combination with other errors, such as a defocus error, may lead to an unwanted shift of the feature patterned on the substrate W, thereby leading to lithographic errors such as overlay errors. Imaging telecentricity may at least partially depend upon an angular reflectivity profile of the multilayer structure 100 (i.e., in the example of FIG. 1, the TIS or ILIAS fiducial marker apodization). Due to differences in materials and layer thicknesses, different multilayer structures 100 have different reflectivity properties, which may be referred to in the art as "apodization fingerprints". In the example of FIG. 1, each multilayer structure 100 used in combination with the measurement system comprising the multilayer structure 100 and sensor 110 has its own corresponding EUV reflectivity properties across the applicable range of angles of incidence of electromagnetic radiation (i.e. the numerical aperture of the lithographic apparatus LA or the so-called "pupil plane"). One important characteristic of a multilayer structure 100 is the centroid wavelength (i.e. the wavelength of electromagnetic radiation at which the multilayer structure 100 is most reflective). The centroid wavelength of a multilayer structure 100 is at least partially determined by the thicknesses of the layers of the multilayer structure 100. Multilayer structures 100 are therefore manufactured with rigorous manufacturing tolerances. Despite these rigorous manufacturing tolerances, differences in reflectivity properties, and resulting imaging telecentricity effects, exist between different multilayer structures 100.

In known apparatus the influence of the angle-dependent reflective properties of multilayered structures (e.g., in the example of known lithographic apparatus, fiducial apodization) is uncorrected for. As such, when used as part of a measurement system, the unaccounted influences of the angle-dependent reflective properties of the multilayer structure may be erroneously attributed to other inaccuracies. For example, in known lithographic apparatus, fiducial apodization may be considered to be a pupil measurement error, whereby the actual performance of the illumination system, as measured by the measurement system comprising the multilayer structure, is better than the measurement system reports. Other lithographic processes that may be influenced by the fiducial apodization of the multilayer structure include imaging (e.g. when performing simulations using measured pupils) and projection (e.g. when determining and/or calibrating the apodization of other parts, such as the projection system).

FIG. 2 schematically depicts a portion of the lithographic apparatus LA of FIG. 1 comprising an apparatus for determining an angular reflectivity profile of the multilayer structure 100 in accordance with an aspect of the present disclosure. The apparatus comprises an illumination system (not shown in FIG. 2) configured to condition electromagnetic radiation B. The apparatus comprises the multilayer structure 100 configured to reflect the electromagnetic radiation B. The multilayer structure 100 may comprise alternating layers of two or more materials. For example, the multilayer structure 100 may comprise about forty alternating layers of Molybdenum and Silicon. The multilayer structure 100 may further comprise an absorber layer and a capping layer. The absorber layer may for example, comprise a Tantalum-based material. The capping layer may, for example, comprise Ruthenium. Other materials and total layer numbers may be used. An angular reflectivity and wavelength response (e.g. the centroid wavelength) of the multilayer structure 100 is at least partially determined by thicknesses of the individual Molybdenum and Silicon layers, the intermixing layers in-between, and the top layers such as the Ruthenium cap layer. For example, the Ruthenium cap layer may have a substantial impact on the reflectivity properties of the multilayer structure 100. In general, the thicker the Molybdenum and Silicon layers, the larger the centroid wavelength becomes, and vice versa. Depending on the application, the layers of the multilayer structure 10 may be selected to reflect a given range of wavelengths of electromagnetic radiation. In the example of the EUV lithographic apparatus of FIG. 1, the layers may be designed to provide a greatest reflectivity for EUV light having a wavelength of, for example, 13.53 nm. One or more layers of the multilayer structure 100 may be affected by passive processes such as, for example, temperatures changes and/or oxidation. One or more layers of the multilayer structure 100 may be affected by manufacturing processes such as, for example, etching and/or cleaning steps during production, gas flood cleaning procedures in the lithographic apparatus, etc. Each multilayer structure 100 therefore tends to have its own angle and wavelength dependent reflectivity properties (e.g. fiducial apodization).

In the example of FIG. 2, the apparatus comprises a diffuser 130 configured to interact with the electromagnetic radiation 105 before reflection from the multilayer structure 100 such that the reflected electromagnetic radiation 140 substantially fills a numerical aperture of the apparatus. In the example of FIG. 2, the diffuser 130 comprises an optically rough layer deposited proximate (e.g. underneath) the multilayer structure 100 and configured to scatter incident electromagnetic radiation B. The diffuser 130 may take other forms and/or and may be located elsewhere in the apparatus (e.g. a separate optical element located upstream of the multiyear structure 100). The diffuser 130 scatters incident electromagnetic radiation 105 across a wide range of directions such that the electromagnetic radiation 105 is incident upon the multilayer structure 100 across a greater number of angles of incidence. The multilayer structure 100 thereby reflects the electromagnetic radiation 105 across a greater number of angles corresponding to a numerical aperture of the apparatus. The diffuser 130 thereby provides a substantially complete probing of the angle-dependent reflectivity profile of the multilayer structure 100 across an entire numerical aperture of the apparatus. For example, the illumination system may provide a beam of electromagnetic radiation 105 comprising a discrete angular distribution of electromagnetic radiation, which may then be converted to a continuous angular distribution of electromagnetic radiation 140 after interaction with the diffuser 130 and the multilayer structure 100. In the example of FIG. 2, it can be seen that the reflected electromagnetic radiation 140 substantially fills an entrance 150 of the projection system PS.

Electromagnetic radiation 140 reflected by the multilayer structure 100 propagates through the projection system PS. As previously discussed, the projection system PS comprises a plurality of mirrors 13-18, typically configured to project a patterned EUV radiation beam B' onto the substrate W, as shown in FIG. 1. However, in FIG. 2 the lithographic apparatus has been reconfigured to perform a pupil measurement (i.e. how the intensity of the electromagnetic radiation 140 varies across an angular distribution, or pupil position, of the electromagnetic radiation 140). The apparatus comprises the sensor 110 configured to detect an angular distribution of the electromagnetic radiation 140 after reflection from the multilayer structure 100. In the example of FIG. 2, the sensor is an ILIAS sensor. The sensor 110 comprises a shearing grating structure 155 as a radiation-receiving element, and a camera chip 160 as a radiation-detecting element. Different diffraction orders are detected at different areas of the camera chip 160. The sensor is configured to measure the substantially full pupil (as filled by the electromagnetic radiation 140 after interaction with the diffuser 130) at wafer level (e.g. proximate the substrate table WT of FIG. 1). An example of a series of pupil images detected by the sensor 110 is described below with reference to FIG. 7. The following discussion with reference to FIGS. 3-6 aids understanding of FIG. 7.

Figure 3:
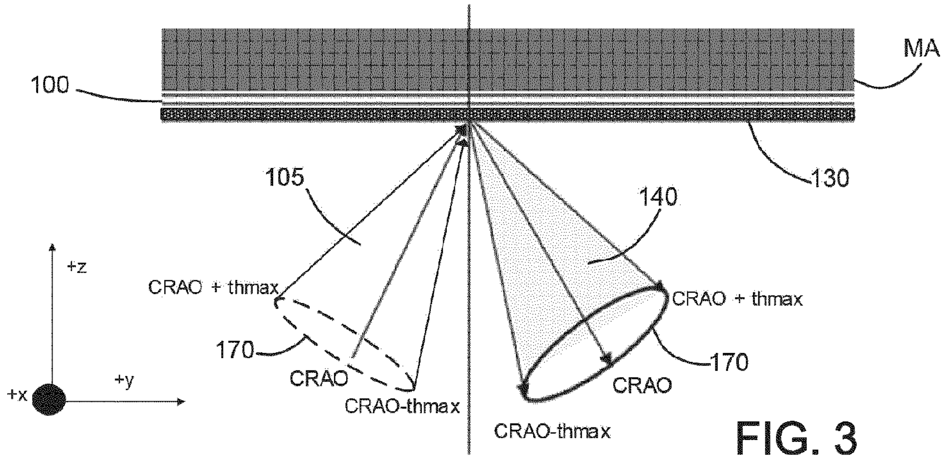
FIG. 3 schematically depicts an angular distribution of electromagnetic radiation reflecting from a multilayer structure.

FIG. 3 schematically depicts an angular distribution of electromagnetic radiation 140 reflecting from a multilayer structure 100. The incident electromagnetic radiation 105 comprises a chief ray angle of incidence CRAO. An angular distribution of the incident electromagnetic radiation 105 exists between a positive maximum angle of incidence CRAO+thmax and a negative maximum angle of incidence CRAO−thmax, forming a conical volume within which the incident electromagnetic radiation 105 propagates. The incident electromagnetic radiation 105 may comprise a discrete angular distribution that does not fill a numerical aperture 170 of the apparatus. That is, there are angles of incidence within the conical volume at which the electromagnetic radiation does not propagate. After interaction with the diffuser 130 and the multilayer structure 100, the reflected electromagnetic radiation 140 has a substantially continuous angular distribution of electromagnetic radiation 140 that substantially fills the numerical aperture 170 of the apparatus. That is, the reflected electromagnetic radiation 140 propagates at substantially all angles of incidence within the conical volume.

Figure 4:
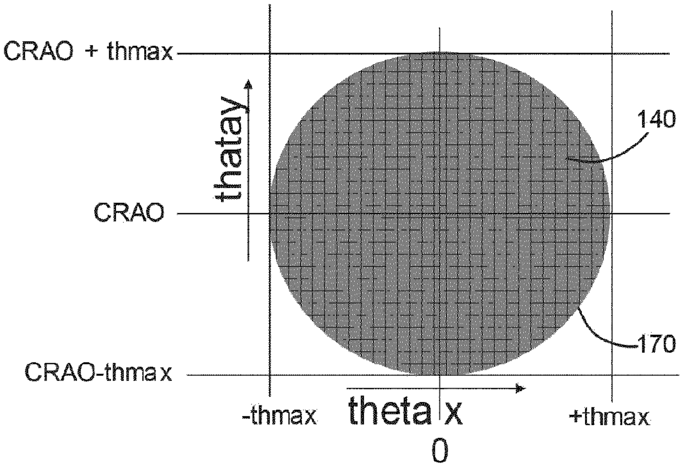
FIG. 4 shows the angular distribution of the reflected electromagnetic radiation of FIG. 3 represented in a pupil plane having angular coordinates.

FIG. 4 shows the angular distribution of the reflected electromagnetic radiation 140 of FIG. 3 represented in a pupil plane having angular coordinates theta x and theta y. Theta represents an angle of incidence of the reflected electromagnetic radiation 140. Theta x extends along the x axis shown in FIG. 3 and has a maximum value of +thmax and a minimum value of CRAO−thmax. Theta y extends along the y axis shown in FIG. 3 and has a maximum value of CRAO+thmax and a minimum value of CRAO−thmax. The magnitude of the extent of the angles of incidence thmax may have a value of, for example, about 4.8°. When viewed in the pupil plane, the reflected electromagnetic radiation 140 has a substantially continuous circular distribution of angles of incidence. An angle of incidence at a given position I in the pupil plane may be calculated by the following equation:

$$\text{Theta } I = \sqrt{(\text{theta } x^2 + \text{theta } y^2)}$$

Figure 5:
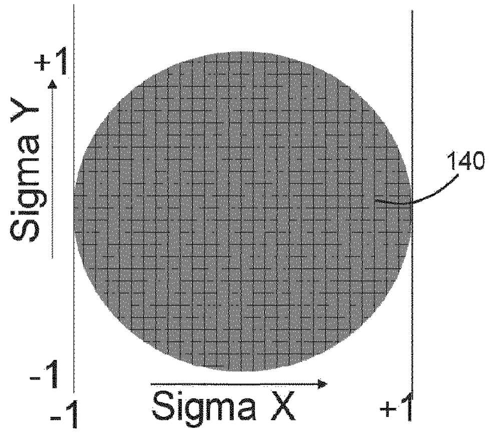
FIG. 5 shows the angular distribution of the electromagnetic radiation of FIG. 4 represented in the pupil plane on a unit circle.

FIG. 5 shows the angular distribution of the electromagnetic radiation of FIG. 4 represented in the pupil plane on a unit circle. The unit circle has dimensionless coordinates ranging from −1 to +1 along a sigma x axis (which corresponds to the theta x axis of FIG. 4) and from −1 to +1 along a sigma y axis (which corresponds to the theta y axis of FIG. 4). A relationship between the numerical aperture of the apparatus and the angles of incidence of the electromagnetic radiation may be defined by the following equation:

$$NA*\text{sigma} = n*\sin(\text{theta})$$

Where NA is the numerical aperture of the apparatus, sigma is a position in the pupil plane on the unit circle, n is the refractive index of the space through which the electromagnetic radiation propagates (e.g. n=1 for a vacuum in an EUV lithographic apparatus such as the one shown in FIG. 1). For example, the numerical aperture of the apparatus may be about 0.33.

Figure 6:
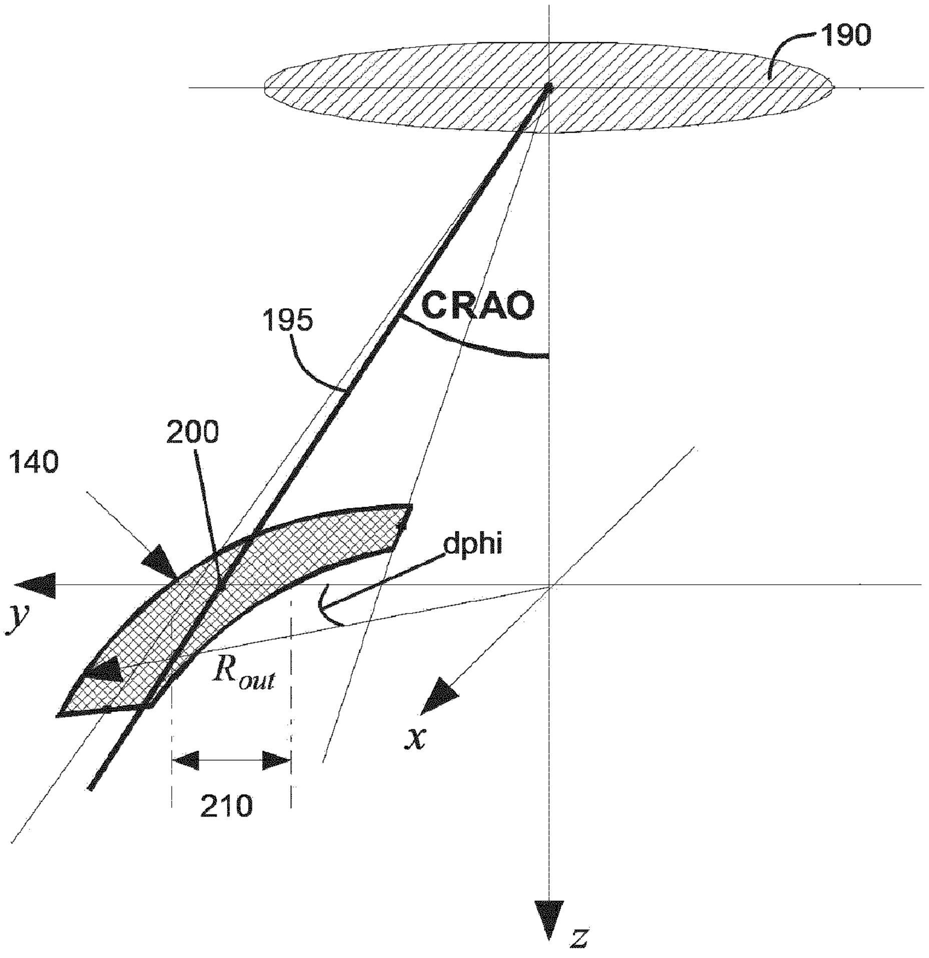
FIG. 6 schematically depicts electromagnetic radiation formed into an illumination field in accordance with an aspect of the present disclosure.
Figures 7A, 7B, 7C, 7D, 7E:
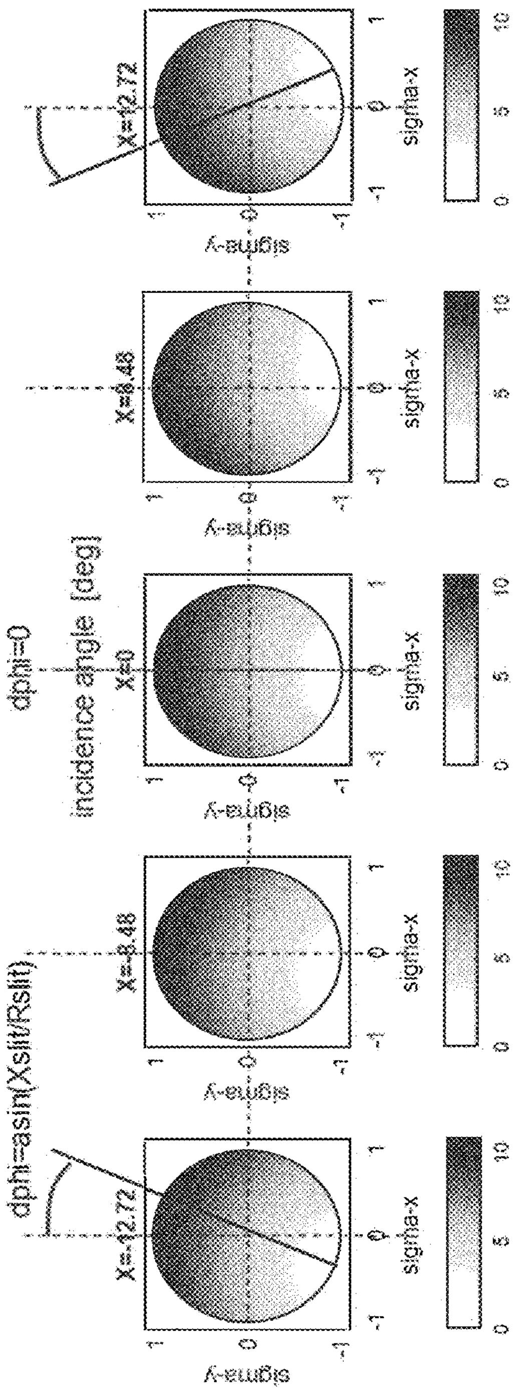
FIGS. 7A-7E show five unit circle pupil plane representations of an angular distribution of electromagnetic radiation rotating through the illumination field of FIG. 6 in accordance with an aspect of the present disclosure.

FIG. 6 schematically depicts electromagnetic radiation formed into an illumination field 180 in accordance with an aspect of the present disclosure. The illumination field 140 may, for example, be formed by the illumination system IL of FIG. 1. In the example of FIG. 6, the illumination field 140 is depicted as viewed at reticle level (i.e. proximate the reticle MA of FIG. 1). The illumination field 140 is reflected by the multilayer structure (not shown) towards an entrance pupil 190 of the projection system PS. A chief ray 195 at a center 200 of the illumination field forms a chief ray angle of incidence CRAO with respect to an optical axis z of the apparatus. In the example of FIG. 6, the illumination field 140 has an arc shape (i.e. the illumination field 140 is part of a circle segment). From the demagnified perspective at substrate W level, the illumination field 140 may, for example, extend in the x-direction from about-13 mm to about 13 mm, with the center 200 of the illumination field 140 being located at x=0. From the perspective at patterning device MA level (i.e. before demagnification), the illumination field 140 may be about four times larger. The chief ray 195 of the illumination field 140 may, for example, have an angle of incidence of about 6° at the center 200 of the illumination field 140. A difference between an inner radius and an outer radius $R_{out}$ of the illumination field 140 may correspond to a scan length 210 of the lithographic apparatus LA along the y axis.

The illumination system IL may comprise a curved reflective surface configured to condition to condition the electromagnetic radiation to form an illumination field 140 through which angles of incidence of the electromagnetic radiation rotate. The curved reflective surface may comprise a plurality of substantially flat reflective elements positioned at different angles to form the curved reflective surface. Rotation of the angular distribution of electromagnetic radiation through the illumination field 140 is described below with reference to FIG. 7. The sensor 110 of FIGS. 1 and 2 is configured to detect the rotation of the angular distribution of the electromagnetic radiation through the illumination field 140 after reflection from the multilayer structure 100.

FIG. 7A-E shows five unit circle pupil plane representations of an angular distribution of electromagnetic radiation rotating through the illumination field of FIG. 6 in accordance with an aspect of the present disclosure. The first pupil plane distribution shown in FIG. 7A corresponds to a left end of the illumination field (i.e. x=−12.72 mm). The second pupil plane distribution shown in FIG. 7B corresponds to a location between the left end and the center 200 of the illumination field 140 (i.e. x=−8.48 mm). The third pupil plane distribution shown in FIG. 7C corresponds to the center 200 of the illumination field 140 (i.e. x=0). The fourth pupil plane distribution shown in FIG. 7D corresponds to a position between the center 200 and a right end of the illumination field 140 (i.e. x=8.48 mm). The fifth pupil plane distribution shown in FIG. 7E corresponds to the right end of the illumination field 140 (i.e. x=12.72 mm). Each angular distribution may comprise angles of incidence upon the multilayer structure ranging from about 1° to about 11° (i.e. +/−5° about the chief ray angle of 6°).

An angle between a radius $R_{out}$ of the illumination field 140 and the y axis may be referred to as an azimuthal angle dphi. At the center 200 of the illumination field 140 the azimuthal angle dphi is zero. When moving away from the center 200 of the illumination field 140 along the x axis a magnitude of the azimuthal angle dphi increases. As can be seen from FIG. 7A-7E, the angular distribution of electromagnetic radiation rotates when moving along the x axis of the illumination field 140 (i.e. as the azimuthal angle dphi changes). The azimuthal angle dphi is defined by the x position in the illumination field 140 and the illumination field radius Rslit in accordance with the following equation:

$$dphi = \sin^{-1}\left(\frac{X_{slit}}{R_{slit}}\right)$$

Where dphi is the azimuthal angle, $X_{slit}$ is the x position in the illumination field 140 and $R_{slit}$ is the radius of the circle segment of which the illumination field 140 forms part. For example, for a circle segment radius $R_{slit}$ of about 40 mm from the perspective at substrate W level (i.e. after demagnification), the azimuthal angle dphi may range from about −18° at an x position Xslit of about −12.72 to about 18° degrees at an x position $X_{slit}$ of about 12.72 from the perspective at substrate level W (i.e. before demagnification).

On average, the characteristics of the multilayer structure 100 that determine angular reflectivity properties (e.g. layer thicknesses) are substantially constant across the illumination field 140 along the x axis. As such, as the angular distribution of the electromagnetic radiation rotates across the illumination field 140, the fiducial apodization imparted to the electromagnetic radiation by the multilayer structure also rotates across the illumination field 140. Given this, the fiducial apodization imparted to the electromagnetic radiation by the multilayer structure multilayer structure may be defined by the reflectivity profile of the multilayer structure at the center 200 of the illumination field 140 which then rotates according to the azimuthal angle dphi.

Figure 8:
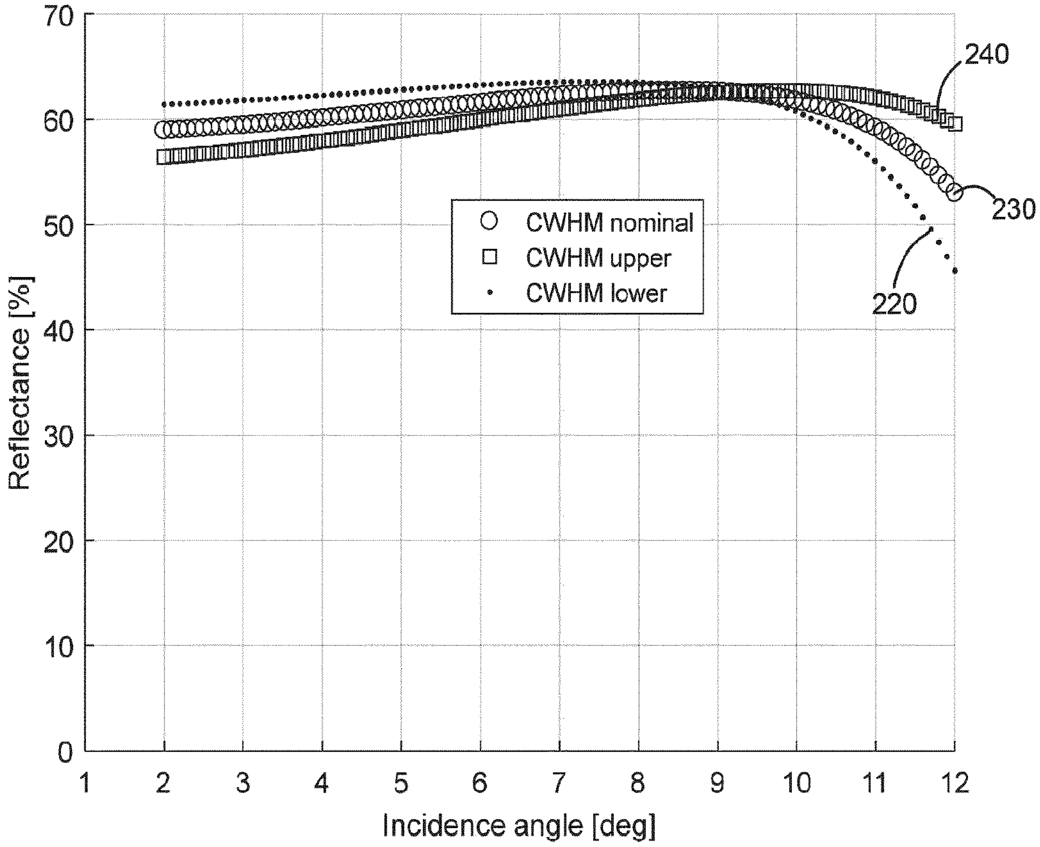
FIG. 8 shows a graph of three known angular reflectivity profiles belonging to three known multilayer structures having different centroid wavelengths.

FIG. 8 shows a graph of three known angular reflectivity profiles 220-240. The three known angular reflectivity profiles belong to three known multilayer structures having different centroid wavelengths. A first known reflectivity profile 220 corresponds to a first known multilayer structure having a relatively low centroid wavelength "CWHM lower". A second known reflectivity profile 230 corresponds to a second known multilayer structure having an average centroid wavelength "CWHM nominal". A third known reflectivity profile 240 corresponds to a third known multilayer structure having relatively high centroid wavelength "CWHM upper". Calibration measurements may be performed to determine the angular reflectivity profiles 220-240 of the known multilayer structures. Alternatively, reflectivity profile information may be provided by a supplier of the known multilayer structures. Across the range of angles of incidence shown in FIG. 8, the known reflectivity profiles 220-240 follow the same general pattern of gradually increasing with increasing angles of incidence until suddenly decreasing at larger angles of incidence. However, the gradients involved differ, and the reflectivities of the known multilayer structures differ significantly at the upper and lower values of angle of incidence. As such, each multilayer structure has its own characteristic angular reflectivity properties. Whilst only three known angular reflectivity profiles are shown in FIG. 8, it will be appreciated that the present invention may utilize a greater number of known reflectivity profiles, such as ten or more, e.g. forty known reflectivity profiles.

Figures 9A, 9B, 9C, 9D, 9E:
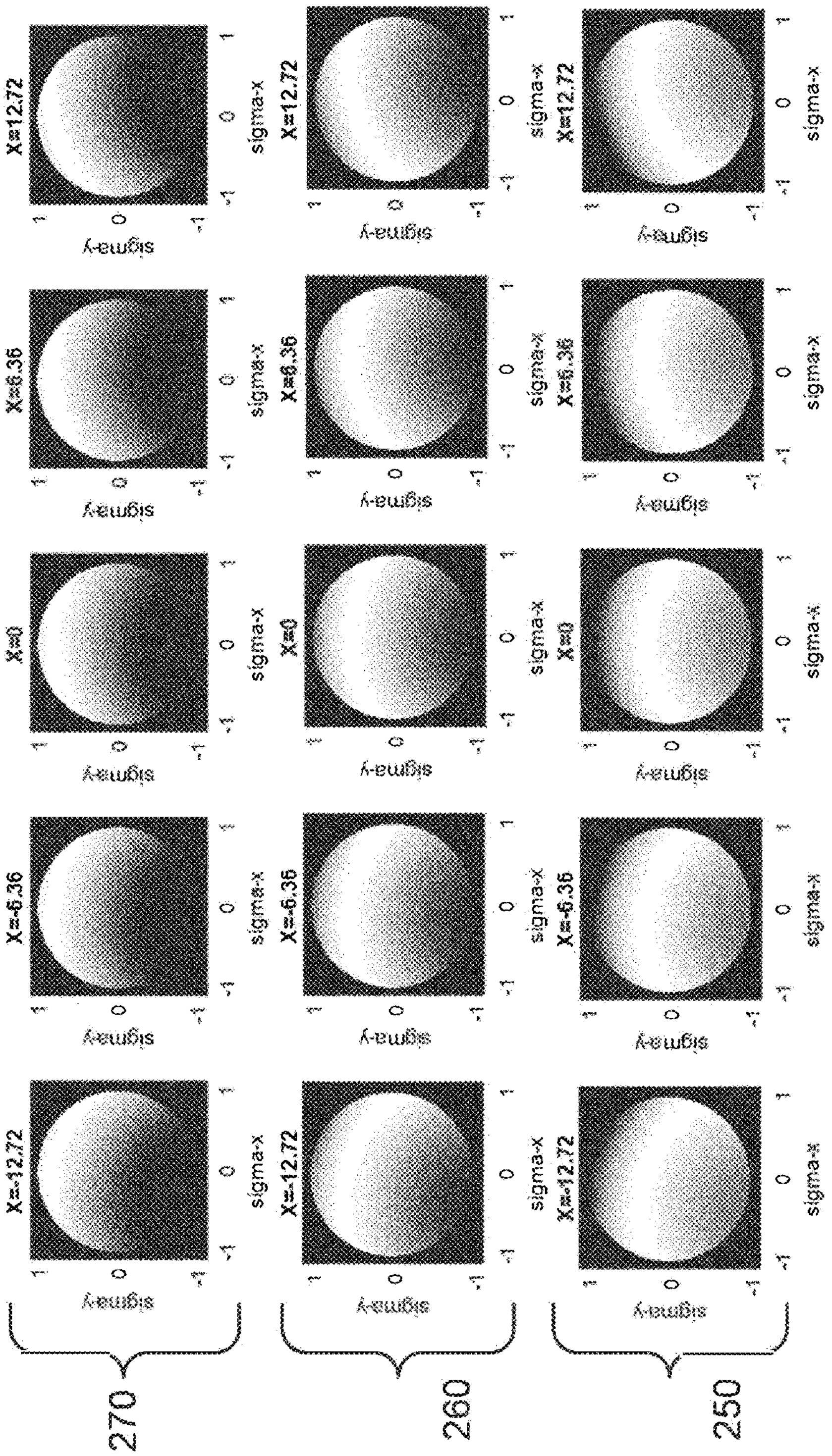
FIGS. 9A-9E show three sets of five unit circle pupil plane representations of the influence of the known angular reflectivity profiles of FIG. 8 on the angular distributions of electromagnetic radiation shown in FIGS. 7A-7E rotating through the illumination field of FIG. 6.

FIG. 9 shows three sets 250-270 of five unit circle pupil plane representations of the influence of the known angular reflectivity profiles of FIG. 8 on the angular distributions of electromagnetic radiation shown in FIG. 7 rotating through the illumination field of FIG. 6. A first set 250 of five unit circle pupil plane representations corresponds to the influence of the first known reflectivity profile 220 having a relatively low centroid wavelength. A second set 260 of five unit circle pupil plane representations corresponds to the influence of the second known reflectivity profile 230 having an average centroid wavelength. A third set 270 of five unit circle pupil plane representations corresponds to the influence of the third known reflectivity profile 240 having a relatively high centroid wavelength. As was the case in FIG. 7, the first pupil plane distributions shown in FIG. 9A correspond to a left end of the illumination field (i.e. x=−12.72 mm). The second pupil plane distributions shown in FIG. 9B correspond to a location between the left end and the center 200 of the illumination field 140 (i.e. x=−8.48 mm). The third pupil plane distributions shown in FIG. 9C correspond to the center 200 of the illumination field 140 (i.e. x=0). The fourth pupil plane distributions shown in FIG. 9D correspond to a position between the center 200 and a right end of the illumination field 140 (i.e. x=8.48 mm). The fifth pupil plane distributions shown in FIG. 9E correspond to the right end of the illumination field 140 (i.e. x=12.72 mm).

The influence of a multilayer structure on the angular distribution of electromagnetic radiation (i.e. the fiducial apodization) varies with centroid wavelength. For example, a known multilayer structure having relatively thin layers may result in a relatively low centroid wavelength reflectivity profile 220, whereas a known multilayer having relatively thick layers may result in a relatively high centroid wavelength reflectivity profile 240. A relatively low centroid wavelength reflectivity profile 220 may shift the angular distribution of electromagnetic radiation towards lower angles of incidence, effectively moving a center of gravity of the angular distribution downwards in the pupil plane (as shown in the first set 250). A relatively high centroid wavelength reflectivity profile 240 may shift the angular distribution of electromagnetic radiation towards larger angles of incidence, effectively moving a center of gravity of the angular distribution upwards in the pupil plane (as shown in the third set 270). Such shifts cause may cause large differences to emerge in the intensities of electromagnetic radiation at different angles of incidence. For example, a radiation beam having a dipole Y illumination mode (e.g. conditioned by the illumination system IL of FIG. 1) may experience a dramatic change in reflectivity between the poles of the dipole Y illumination mode due to the influence of the reflectivity profile of the multilayer structure.

As shown in FIG. 7, the angular distribution of electromagnetic radiation rotates in accordance with the changing azimuthal angle dphi when moving along the x axis of the illumination field 140. As a result, and as shown in FIG. 9, the influences of the known angular reflectivity profiles 220-240 on the angular distribution of electromagnetic radiation also rotate across the illumination field 140. Differences in multilayer properties (e.g. layer materials, thicknesses, etc.) between different multilayer structures having different reflectivity profiles 220-240 are visible as different apodization profiles, which in turn behave differently when moving through the illumination field 140.

The apodization profile for a given multilayer structure may be described using Zernike polynomials, which are a well-known sequence of polynomials that are orthogonal on the unit circle.

A given apodization profile as represented on the unit circle (such as those shown in FIG. 9) may be mathematically constructed using a plurality of Zernike polynomials. Likewise, a given apodization profile may be mathematically decomposed into a plurality of Zernike polynomials having different contributions. A contribution (or magnitude) of a given Zernike polynomial may change in different ways depending on the reflectivity properties (e.g. a centroid wavelength) of a given multilayer structure.

Figure 10:
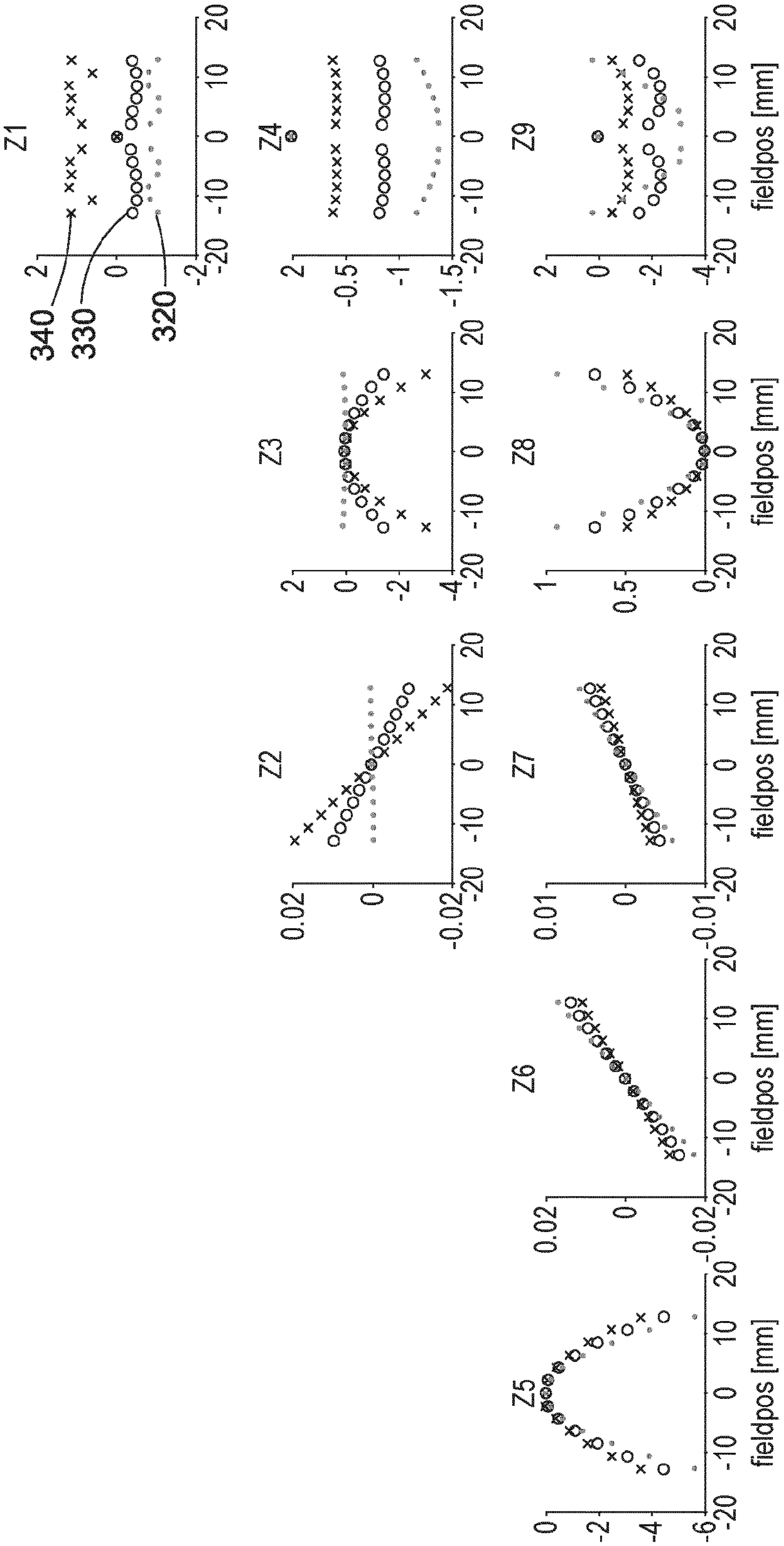
FIG. 10 shows a plurality of Zernike polynomial functions formed by mathematically decomposing the three sets of five unit circle pupil plane representations of FIG. 9 in accordance with an aspect of the present disclosure.

FIG. 10 shows a plurality of Zernike polynomial functions formed by mathematically decomposing the three sets 250-270 of five unit circle pupil plane representations of FIG. 9 in accordance with an aspect of the present disclosure. The first nine Zernike polynomials Z1-Z9 are shown in FIG. 10. It will be appreciated that a greater or smaller number of Zernike polynomials Z1-Z9 may be considered, e.g. up to and including the twenty-fifth Zernike polynomial Z25. The horizontal axis of each graph represents the x position in the illumination field 140 of FIG. 6 (which, as previously described, corresponds to a change in the azimuthal angle dphi). It will be appreciated that FIG. 10 includes a greater number of illumination field x positions than the five shown in FIG. 9A-E. The vertical axis of each graph represents relative intensities of the radiation after reflection from a given multilayer structure. The dots 320 correspond to the first reflectivity profile 220 (i.e. the first set of pupil plane representations 250) having a relatively low centroid wavelength. The circles 330 correspond to the second known reflectivity profile 230 (i.e. the second set of pupil plane representations 260) having an average centroid wavelength. The crosses 340 correspond to the third known reflectivity profile 240 (i.e. the third set of pupil plane representations 270) having a relatively high centroid wavelength.

Zernike polynomials are represented in polar coordinates (r,phi). The right-most column of Zernike polynomials (i.e. Z1, Z4 and Z9) have only a radial dependence. That is, right-most column of Zernike polynomials (i.e. Z1, Z4 and Z9) have no phi-dependence, and are therefore rotationally symmetric. For all other columns, the Zernike polynomials have an angular (phi) dependence (i.e. they are rotationally asymmetric. It is possible to distinguish pairs of rotationally asymmetric Zernike polynomials having the same angular order M and the same radial order such as, for example, Z2 and Z3; Z5 and Z6; etc. It is also possible to distinguish between rotationally asymmetric Zernike polynomials that behave according to sin (M*dhi) (=symmetric in the X-direction) versus rotationally asymmetric Zernike polynomials that behave according to cos (M*dphi) (=symmetric in the Y-direction). For the fiducial apodization profile Zernike decomposition across slit, the angular Zernike coefficient pairs (e.g. Z2 and Z3) can be described using a rotation matrix, using dphi as rotation angle:

$$Z2fidapo(fp) = +\cos(dphi) * Z2(0) - \sin(dphi) * Z3(0) \quad \text{Equation 1}$$

$$Z3fidapo(fp) = +\sin(dphi) * Z2(0) + \cos(dphi) * Z3(0) \quad \text{Equation 2}$$

Where fp indicates the field point position in the illumination field (0=center), and where Z2(0) and Z3(0) are the Z2 and Z3 Zernike coefficient values at the center of the illumination field, respectively.

The amount of Z2 lost over the field "leaks" into Z3, actually such that at each position in the illumination field, Z22 (dphi)+Z32 (dphi) remains constant:

$$Z2(dphi) = r. * \cos(dphi);\ Z3(dphi) = r. * \sin(dphi), \quad \text{Equation 3}$$

$$\text{which obeys } \cos 2(dphi) + \sin 2\,(dphi) = 1$$

It is possible to rotate the (phi,r) polar coordinate system in which the Zernike polynomials are described according to the azimuthal angle dphi. In practice, the radial term r stays the same, whilst angular term phi is given an additional offset dphi, depending on the x position in the illumination field. The additional offset may be applied using a rotation matrix to describe the Zernike polynomials across the illumination field, as a function of azimuthal angle dphi. With reference to FIG. 2, the processor 120 may be configured to generate the plurality of Zernike polynomial functions for each known reflectivity profile associated with the plurality of known multilayer structures.

As can be seen from FIG. 10, the contribution of each Zernike polynomial Z1-Z9 varies differently across the illumination field for each known reflectivity profile 320-340. This variation offers a means by which angular reflectivity profiles of different multilayer structures may be determined by comparison to known reflectivity profiles 320-340. Referring again to FIG. 2, the sensor 110 is configured to detect the angular distribution of the electromagnetic radiation after reflection from the multilayer structure 100. In performing this measurement, the influence of the reflectivity profile of the multilayer structure 100 (i.e. the fiducial apodization) is also measured.

Figure 11:
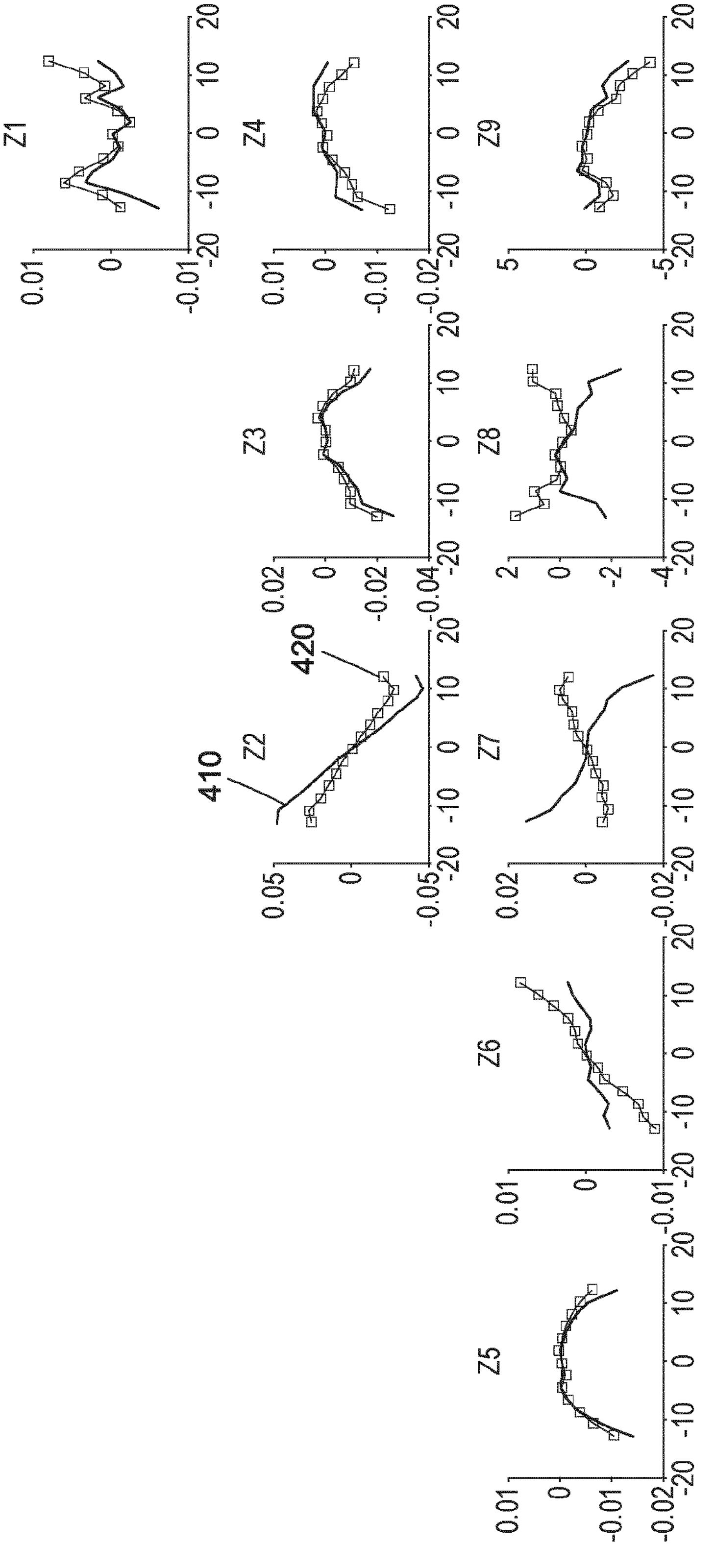
FIG. 11 shows two sets of a plurality of Zernike polynomial functions formed by mathematically decomposing the angular distribution of electromagnetic radiation of FIGS. 7A-7E in accordance with an aspect of the present disclosure.

FIG. 11 shows two sets 410, 420 of a plurality of Zernike polynomial functions Z1-Z9 formed by mathematically decomposing the angular distribution of electromagnetic radiation of FIG. 7 in accordance with an aspect of the present disclosure. The first set 410 of Zernike polynomial functions Z1-Z9 corresponds to the angular distribution of electromagnetic radiation as measured by the sensor 110 at wafer level (i.e. proximate the substrate W in FIG. 1). The second set 420 of Zernike polynomial functions Z1-Z9 corresponds to the angular distribution of electromagnetic radiation at reticle level (i.e. proximate the reticle MA of FIG. 1 before interaction with the multilayer structure 100). The second set 420 may be calculated at least partially based on the first set 410 and knowledge of the projection system PS.

With reference to FIG. 2, the processor 120 is configured to generate a first function 410 at least partially based on the angular distribution of the electromagnetic radiation 140 detected by the sensor 110. An example of a series of functions generated by the processor 120 corresponding to the angular distribution of electromagnetic radiation of FIG. 7 is shown in FIG. 11. The processor 120 is configured to compare the first function to a plurality of known functions 320-340 associated with a plurality of known angular reflectivity profiles 220-240 to identify a second function from the plurality of known functions 220-240 that is most similar to the first function 410. An example of a plurality of known reflectivity profiles 220-240 is shown in FIGS. 8 and 9. An example of a plurality of known functions associated with the plurality of known angular reflectivity profiles 220-240 is shown in FIG. 10. The processor 120 is configured to determine an angular reflectivity profile of the multilayer structure 100 at least partially based on a known angular reflectivity profile 220-240 that is associated with the second function.

The processor 120 is configured to generate the first function by mathematically decomposing the angular distribution of the electromagnetic radiation detected by the sensor 110 into a plurality of Zernike polynomial functions 410. Mathematically decomposing generally involves representing or expressing a function as a combination of simpler component functions. In this instance, the angular distribution of the electromagnetic radiation detected by the sensor is represented as a combination of component Zernike polynomial functions Z1-Z9. The processor 120 may perform the decomposition across the illumination field in a manner similar to that described above in relation to Equations 1-3.

In practice, when the sensor 110 measures the angular distribution of electromagnetic radiation across the illumination field, the resulting measurement comprises the fiducial apodization caused by the multilayer structure 100 (which rotates according to the azimuthal angle dphi) along with other contributions from other optical components of the lithographic apparatus LA. A first additional contribution is that provided by the projection system PS. Optical elements of the projection system PS have their own angular reflectivity profiles which impart their own apodization influence to the electromagnetic radiation before the electromagnetic radiation reaches the sensor 110. A second additional contribution is that provided by the diffuser 130. The reflectivity profile of the diffuser 130 may be defined by scattering properties of the rough layer that forms the diffuser 130. The scattering profile of the diffuser 130 may in turn be defined by a local surface roughness. Diffuser 130 reflectivity profiles typically have a shape that resembles a Gaussian distribution.

In the case of a lithographic apparatus LA, one purpose of the pupil measurement (such as those performed by ILIAS) is to characterize the pupil plane (i.e. the angular distribution of electromagnetic radiation) before reticle level MA. Given that the ILIAS sensor is present at wafer level W, both the apodization contributions of the projection system PS and of the multilayer structure 100 must be corrected for. It is therefore beneficial to separate the fiducial apodization caused by the multilayer structure 100 from the other contributions. A practical way to go about this is to subtract the decomposed Zernike polynomials as determined at the center of the illumination field. This removes the substantially constant Gaussian diffuser contribution as well as removing any rotationally symmetric Zernike polynomials (e.g. radial Zernikes Z1,Z9,Z16, etc.), leaving the rotationally asymmetric polynomials that vary across the illumination field due to the rotation of the fiducial apodization contribution across the illumination field as described above with reference to FIG. 9.

In general, the Zernike polynomials have a part that is related to the multilayer structure Zfidapo and part that is related to rotationally symmetric (i.e. "static" across the illumination field) contributions Zresidual. For Z2 and Z3 it is possible to define the following relationships:

$$Z2(fp) = Z2fidapo(fp) + Z2 \text{ residual } (fp) \quad \text{Equation 4}$$

$$Z3(fp) = Z3fidapo(fp) + Z3 \text{ residual } (fp) \quad \text{Equation 5}$$

When moving away from the center (i.e. x=0) of the illumination field, the part related to the multilayer structure Zfidapo rotates over the azimuthal angle dphi in accordance with the following relationships:

$$Z2fidapo(fp) = \cos(dphi) * Z2fidapo(0) - \sin(dphi) * Z3fidapo(0) \quad \text{Equation 6}$$

$$Z3fidapo(fp) = \sin(dphi) * Z2fidapo(0) + \cos(dphi) * Z3fidapo(0) \quad \text{Equation 7}$$

Z2fidapo(0) can be defined as being equal to zero because the profile is symmetrical across the Y axis. Substitution of the equations 4-7 provides the following relationships:

$$Z2(fp) = -\sin(dphi) * Z3fidapo(0) + Z2 \text{ residual } (fp) \quad \text{Equation 8}$$

$$Z2(fp) = +\cos(dphi) * Z3fidapo(0) + Z3 \text{ residual } (fp) \quad \text{Equation 9}$$

Assuming that the residual part is constant, the last part of the equations is removed by the center value (i.e. x=0) subtraction. That is, subtraction of Zcentre and assuming that Zresidual is constant across all positions along the illumination field:

$$Z2(fp) - Z2(0) = [-\sin(dphi) * Z3fidapo(0) + Z2 \text{ residual}(fp)] - [\sin(0) * Z3fidapo(0) + Z2 \text{ residual } (0)] \quad \text{Equation 10}$$

$$Z3(fp) - Z3(0) = [\cos(dphi) * Z3fidapo(0) + Z3 \text{ residual } (fp)] - [\cos(0) * Z3fidapo(0) + Z3 \text{ residual } (0)] \quad \text{Equation 11}$$

This results in the following relationships:

$$dZ2\_centercor(fp) = -\sin(dphi) * Z3fidapo(0) \quad \text{Equation 12}$$

$$dZ3\_centercor(fp) = [\cos(dphi) - 1] * Z3fidapo(0) \quad \text{Equation 13}$$

By fitting the delta Zernike profiles for Z2 and Z3 it is possible to obtain the value of Z3fidapo (i.e. the part of the Zernike polynomial that is related to the multilayer structure) at the center of the illumination field. The same holds true for all other rotationally asymmetric Zernike polynomial pairs having the same angular and radial order (e.g. Z5 and Z6, etc.). The processor 120 may be configured to perform a fitting process to identify the second function from the plurality of known functions. For example, a fitting algorithm may compare the Zernike profile of the angular distribution of electromagnetic radiation detected by the sensor 110 to the Zernike profiles of the known reflectivity profiles 220-240 and identify which known reflectivity profile 220-240 matches the measured behavior best. The best fitting known Zernike profile may then be defined as the Zernike profile of the multilayer structure 100. The fitting algorithm may be configured to separate the contribution of the Zernike polynomials that rotate through the illumination field (and are therefore attributable to the fiducial apodization associated with the multilayer structure) from other, rotationally static contributions (e.g. from the projection system PS or from the diffuser 130 scattering profile).

Fitting the delta Zernike profiles may comprise performing a least squares fit. For example, given that the delate Zernike profiles (e.g. the profiles given by equations 12 and 13) are sine and cosine functions, by fitting sine and cosine functions directly to the measured Zernike profiles, amplitudes of said profiles may be determined. In the above example of the dZ2 and dZ3 profiles, the amplitude is Z3fidapo(0). The same reasoning applies for other pairs of Zernike profiles that change with changes in the azimuthal angle, as described above. A set of measured Zernike amplitudes, "Zmeas" may thereby by determined. This exercise may be repeated for all known reflectivity profiles "$Zref_n$", and the smallest norm compared to the measured reflectivity profile, e.g. $\min(\| Zmeas - Zref_n \|)$, may be determined to find the best matching known reflectivity profile. The measured Zernike amplitude values Zmeas that have poor correlation with the known reflectivity profiles (e.g. a relatively low $R^2$ value) may be disregarded (i.e. these are the profiles that do not look like the predicted sine/cosine functions). Other fitting processes may be used, e.g. least absolute deviations, etc.

The outcome of the processing may be understood as a description of the fiducial apodization profile of the multilayer structure 100 in the pupil plane. The fiducial apodization profile of the multilayer structure 100 may be stored in memory, and from there onwards referred to when performing pupil measurements such as, for example, when measuring illumination characteristics for illumination system IL qualification, when measuring projection characteristics for the projection system PS characterization, etc.

The processor 120 may use the angular reflectivity profile of the multilayer structure 100 to improve an understanding and operation of the illumination system IL. For example, the processor 120 may be configured to determine an angular reflectivity profile of the illumination system IL in at least partial dependence upon the angular reflectivity profile of the multilayer structure determined by the processor 120. This may involve removing the influence of the angular reflectivity profile of the multilayer structure 100 from the angular distribution of the electromagnetic radiation detected by the sensor 110 (e.g. the angular distributions shown in FIG. 7A-E). The processor 120 may be configured to perform a simulation of a proposed radiation beam B propagating through the lithographic apparatus LA in at least partial dependence upon the angular reflectivity profile of the illumination system IL.

The processor 120 may use the angular reflectivity profile of the multilayer structure 100 to improve an understanding and operation of the projection system PS. For example, the processor 120 may be configured to determine an angular reflectivity profile of the projection system PS in at least partial dependence upon the angular reflectivity profile of the multilayer structure 100. This may involve removing the influence of the angular reflectivity profile of the multilayer structure 100 from the angular distribution of the electromagnetic radiation detected by the sensor 110. For example, the sensor 110 may be configured to measure several shifted pupils (i.e. angular distributions of electromagnetic radiation) that are later used by an algorithm (e.g. by the processor 120) to decouple the contributions of the illumination system IL and the projection system PS. This process may involve measuring the same pupil at different incidence angles. To achieve this, the reticle stage MT may be tilted to change the angle of the radiation beam B entering the projection system PS.

Figure 12:
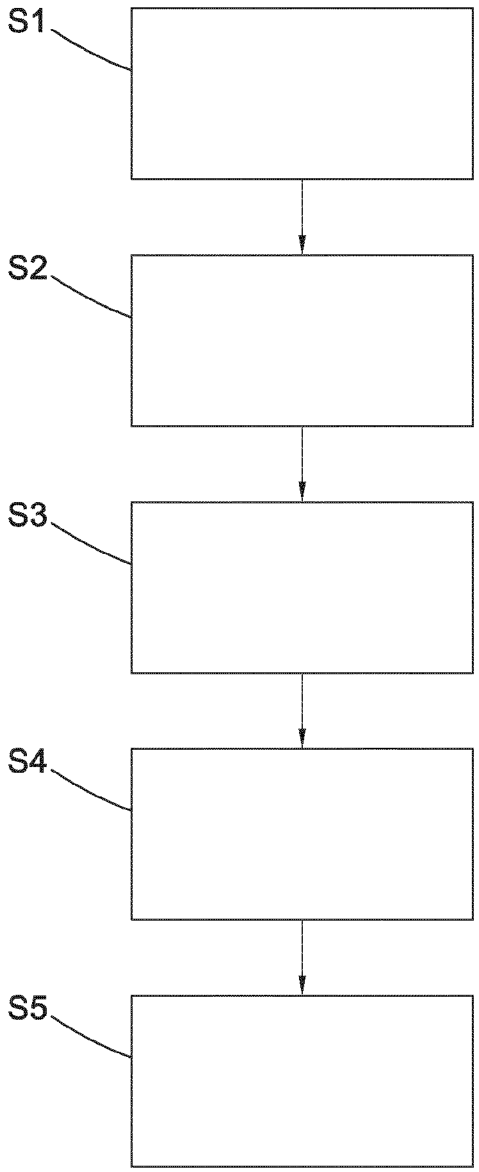
FIG. 12 shows a method of determining an angular reflectivity profile of a multilayer structure in accordance with an aspect of the present disclosure.

FIG. 12 shows a method of determining an angular reflectivity profile of a multilayer structure in accordance with an aspect of the present disclosure. A first step S1 comprises reflecting the electromagnetic radiation from the multilayer structure. A second step S2 comprises detecting an angular distribution of the electromagnetic radiation after reflection from the multilayer structure. A third step S3 comprises generating a first function at least partially based on the angular distribution of the electromagnetic radiation. A fourth step S4 comprises comparing the first function to a plurality of known functions associated with a plurality of known angular reflectivity profiles to identify a second function from the plurality of known functions that is most similar to the first function. A fifth step S5 comprises determining the angular reflectivity profile of the multilayer structure at least partially based on a known angular reflectivity profile that is associated with the second function.

The method may comprise an optional step of conditioning the electromagnetic radiation to form an illumination field through which the angular distribution of the electromagnetic radiation rotates. Detecting the angular distribution of the electromagnetic radiation may comprise detecting the rotation of the angular distribution of the electromagnetic radiation through the illumination field after reflection from the multilayer structure. The method may comprise an optional step of diffusing the electromagnetic radiation before reflection from the multilayer structure such that the angular distribution of the electromagnetic radiation is substantially continuous. Generating the first function comprises mathematically decomposing the angular distribution of the electromagnetic radiation into a plurality of Zernike polynomial functions. The plurality of Zernike polynomial functions may exclude rotationally symmetric Zernike polynomial functions. Comparing the first function to a plurality of known functions associated with a plurality of known angular reflectivity profiles to identify a second function from the plurality of known functions that is most similar to the first function may comprise performing a fitting process.

A method of projecting a patterned beam of radiation onto a substrate may comprise using the multilayer structure to perform a measurement, and accounting for the angular reflectivity profile of the multilayer structure determined using the method of FIG. 12 in said measurement. Conditioning the electromagnetic radiation may comprise using the illumination system IL, and accounting for the angular reflectivity profile of the multilayer structure may comprise determining an angular reflectivity profile of the illumination system IL in at least partial dependence upon the angular reflectivity profile of the multilayer structure. The method may comprise an optional step of performing a simulation of a proposed patterned beam of radiation in at least partial dependence upon the angular reflectivity profile of the illumination system. Projecting the patterned beam of radiation onto the substrate may comprise using the projection system PS, and accounting for the angular reflectivity profile of the multilayer structure may comprise determining an angular reflectivity profile of the projection system in at least partial dependence upon the angular reflectivity profile of the multilayer structure.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions. Technical fields in which the invention may be utilized include EUV image sensing, EUV illumination, EUV imaging and EUV projection.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world. For example, a computer program comprising computer readable instructions may be configured to cause a computer to carry out the method of FIG. 12 and any optional steps thereof. A computer readable medium may be configured to carry the computer program. As another example, a computer apparatus may comprise a memory storing processor readable instructions and a processor arranged to read and execute instructions stored in said memory. Said processor readable instructions may comprise instructions arranged to control the computer to carry out the method of FIG. 12 and any optional steps thereof.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

CLAUSES

1. A method of determining an angular reflectivity profile of a multilayer structure comprising:
   reflecting electromagnetic radiation from a multilayer structure;

detecting an angular distribution of the electromagnetic radiation after reflection from the multilayer structure;

generating a first function at least partially based on the angular distribution of the electromagnetic radiation;

comparing the first function to a plurality of known functions associated with a plurality of known angular reflectivity profiles to identify a second function from the plurality of known functions that is most similar to the first function; and, determining the angular reflectivity profile of the multilayer structure at least partially based on a known angular reflectivity profile that is associated with the second function.

2. The method of clause 1, comprising conditioning the electromagnetic radiation to form an illumination field through which the angular distribution of the electromagnetic radiation rotates, and wherein detecting the angular distribution of the electromagnetic radiation comprises detecting the rotation of the angular distribution of the electromagnetic radiation through the illumination field after reflection from the multilayer structure.

3. The method of clause 1 or clause 2, comprising diffusing the electromagnetic radiation before reflection from the multilayer structure such that the angular distribution of the electromagnetic radiation is substantially continuous.

4. The method of any of clauses 1 to 3, wherein generating the first function comprises mathematically decomposing the angular distribution of the electromagnetic radiation into a plurality of Zernike polynomial functions.

5. The method of clauses 2 to 4, wherein the plurality of Zernike polynomial functions excludes rotationally symmetric Zernike polynomial functions.

6. The method of any of clauses 1 to 5, wherein comparing the first function to a plurality of known functions associated with a plurality of known angular reflectivity profiles to identify a second function from the plurality of known functions that is most similar to the first function comprises performing a fitting process.

7. A method of projecting a patterned beam of radiation onto a substrate comprising:

using the multilayer structure of any of clauses 1 to 6 to perform a measurement; and, accounting for the angular reflectivity profile of the multilayer structure determined using the method of any of clauses 1 to 6 in said measurement.

8. The method of clause 7, wherein conditioning the electromagnetic radiation comprises using an illumination system, and wherein accounting for the angular reflectivity profile of the multilayer structure comprises determining an angular reflectivity profile of the illumination system in at least partial dependence upon the angular reflectivity profile of the multilayer structure.

9. The method of clause 7 or clause 8, comprising performing a simulation of a proposed patterned beam of radiation in at least partial dependence upon the angular reflectivity profile of the illumination system.

10. The method of any of clauses 7 to 9, wherein projecting the patterned beam of radiation onto the substrate comprises using a projection system, and wherein accounting for the angular reflectivity profile of the multilayer structure comprises determining an angular reflectivity profile of the projection system in at least partial dependence upon the angular reflectivity profile of the multilayer structure.

11. A computer program comprising computer readable instructions configured to cause a computer to carry out a method according to any of clauses 1 to 10.

12. A computer readable medium carrying a computer program according to clause 11.

13. A computer apparatus comprising:

a memory storing processor readable instructions; and a processor arranged to read and execute instructions stored in said memory;

wherein said processor readable instructions comprise instructions arranged to control the computer to carry out a method according to any of claims 1 to 10

The invention claimed is:

1. An apparatus comprising:

a sensor configured to detect an angular distribution of electromagnetic radiation after reflection from a multilayer structure; and a processor configured to:

generate a first function at least partially based on the angular distribution of the electromagnetic radiation detected by the sensor;

compare the first function to a plurality of known functions associated with a plurality of known angular reflectivity profiles to identify a second function from the plurality of known functions that is most similar to the first function; and determine an angular reflectivity profile of the multilayer structure at least partially based on a known angular reflectivity profile that is associated with the second function.

2. The apparatus of claim 1, further comprising:

an illumination system configured to condition the electromagnetic radiation to form an illumination field through which the angular distribution of the electromagnetic radiation rotates, and wherein the sensor is configured to detect the rotation of the angular distribution of the electromagnetic radiation through the illumination field after reflection from the multilayer structure.

3. The apparatus of claim 1, further comprising a diffuser configured to interact with the electromagnetic radiation such that the electromagnetic radiation substantially fills a numerical aperture of the apparatus.

4. The apparatus of claim 1, wherein the processor is configured to generate the first function by mathematically decomposing the angular distribution of the electromagnetic radiation detected by the sensor into a plurality of Zernike polynomial functions.

5. The apparatus of claim 4, wherein the plurality of Zernike polynomial functions excludes rotationally symmetric Zernike polynomial functions.

6. The apparatus of claim 1, wherein the processor is configured to perform a fitting process to identify the second function from the plurality of known functions.

7. A lithographic apparatus comprising:

the apparatus of claim 1;

a support structure constructed to support a patterning device, the patterning device being capable of imparting a radiation beam with a pattern in its cross-section to form a patterned radiation beam, wherein the multilayer structure forms part of a fiducial marker located on the patterning device or the support structure;

a substrate table constructed to hold a substrate, wherein the sensor forms part of the substrate table; and a projection system configured to project the patterned radiation beam.

8. The lithographic apparatus of claim 7, further comprising an illumination system configured to condition the radiation beam; and wherein the processor is configured to determine an angular reflectivity profile of the illumination system in at least partial dependence upon the angular reflectivity profile of the multilayer structure.

9. The lithographic apparatus of claim 8, wherein the processor is configured to perform a simulation of proposed radiation propagating through the lithographic apparatus in at least partial dependence upon the angular reflectivity profile of the illumination system.

10. The lithographic apparatus of claim 7, wherein the processor is configured to determine an angular reflectivity profile of the projection system in at least partial dependence upon the angular reflectivity profile of the multilayer structure.

11. A method comprising:

reflecting electromagnetic radiation from a multilayer structure;

detecting an angular distribution of the electromagnetic radiation after reflection from the multilayer structure;

generating a first function at least partially based on the angular distribution of the electromagnetic radiation;

comparing the first function to a plurality of known functions associated with a plurality of known angular reflectivity profiles to identify a second function from the plurality of known functions that is most similar to the first function; and determining an angular reflectivity profile of the multilayer structure at least partially based on a known angular reflectivity profile that is associated with the second function.

12. The method of claim 11, further comprising:

conditioning the electromagnetic radiation to form an illumination field through which the angular distribution of the electromagnetic radiation rotates, and wherein the detecting the angular distribution of the electromagnetic radiation comprises detecting the rotation of the angular distribution of the electromagnetic radiation through the illumination field after reflection from the multilayer structure.

13. The method of claim 11, further comprising diffusing the electromagnetic radiation before reflection from the multilayer structure such that the angular distribution of the electromagnetic radiation is substantially continuous.

14. The method of claim 11, wherein the generating the first function comprises mathematically decomposing the angular distribution of the electromagnetic radiation into a plurality of Zemike polynomial functions.

15. A non-transitory computer-readable medium comprising stored processor readable instructions, the processor readable instructions, when executed by a computer system, are arranged to cause the computer system to at least:

provide a signal to a sensor system configured to detect an angular distribution of electromagnetic radiation after reflection from a multilayer structure to obtain a detected angular distribution of electromagnetic radiation after reflection from a multilayer structure;

generate a first function at least partially based on the angular distribution of the electromagnetic radiation;

compare the first function to a plurality of known functions associated with a plurality of known angular reflectivity profiles to identify a second function from the plurality of known functions that is most similar to the first function; and determine an angular reflectivity profile of the multilayer structure at least partially based on a known angular reflectivity profile that is associated with the second function.

16. The computer-readable medium of claim 15, wherein the instructions are further configured to cause the computer system to generate the first function by mathematically decomposing the detected angular distribution of the electromagnetic radiation into a plurality of Zernike polynomial functions.

17. The computer-readable medium of claim 16, wherein the plurality of Zernike polynomial functions excludes rotationally symmetric Zernike polynomial functions.

18. The computer-readable medium of claim 15, wherein the instructions are further configured to cause the computer system to perform a fitting process to identify the second function from the plurality of known functions.

19. The computer-readable medium of claim 15, wherein the instructions are further configured to cause the computer system to determine an angular reflectivity profile of an illumination system configured to condition radiation provided to the multilayer structure in at least partial dependence upon the angular reflectivity profile of the multilayer structure.

20. The computer-readable medium of claim 15, wherein the instructions are further configured to cause the computer system to determine an angular reflectivity profile of a projection system configured to receive radiation from the multilayer structure in at least partial dependence upon the angular reflectivity profile of the multilayer structure.

* * * * *